(12) United States Patent
Nagaoka et al.

(10) Patent No.: US 6,797,571 B2
(45) Date of Patent: Sep. 28, 2004

(54) METHOD OF MANUFACTURING SEMICONDUCTOR DEVICE

(75) Inventors: Kojiro Nagaoka, Kanagawa (JP); Masaki Saito, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 10/273,171

(22) Filed: Oct. 18, 2002

(65) Prior Publication Data
US 2003/0113971 A1 Jun. 19, 2003

(30) Foreign Application Priority Data
Oct. 25, 2001 (JP) .................................... P2001-327038

(51) Int. Cl.[7] .................. H01L 21/336; H01L 21/3205; H01L 21/4763
(52) U.S. Cl. ...................... 438/287; 438/488; 438/505; 438/585
(58) Field of Search .............................. 438/287, 488, 438/505, 585

(56) References Cited

U.S. PATENT DOCUMENTS 4,481,229 A * 11/1984 Suzuki et al. ................ 427/571
6,376,349 B1 * 4/2002 Tobin et al. ................. 438/592

* cited by examiner

*Primary Examiner*—Alexander Ghyka
(74) *Attorney, Agent, or Firm*—Rader, Fishman & Grauer PLLC; Ronald P. Kananen

(57) ABSTRACT

The present invention provides a method of manufacturing a semiconductor device, in which while a conductive layer is formed on an oxide film formed as an insulating layer by using a CVD method, oxygen deficiency of the oxide film can be avoided without any drop in an dielectric breakdown resistance as the insulating layer of the oxide film and without any reduction in a long-term reliability. In this manufacturing method, when the conductive layer as a gate electrode is formed on the oxide film formed as a gate insulating layer, the conductive layer is formed in a non-reducing atmosphere.

6 Claims, 4 Drawing Sheets

METHOD OF MANUFACTURING SEMICONDUCTOR DEVICE

CROSS REFERENCE TO RELATED APPLICATIONS

The present document is based on Japanese Priority Document JP 2001-327038, filed in the Japanese Patent Office on Oct. 25, 2001, the entire contents of which being incorporated herein by reference.

BACKGROUND OF THE INVENTION

1. Field of the Invention

The present invention relates to a method of manufacturing a semiconductor device, which forms a conductive layer composed of a silicon film and the like on an oxide film formed as an insulating layer, by using a chemical vapor deposition (CVD) method, and more particularly relates to a method of manufacturing a semiconductor device, which avoids a drop in an dielectric breakdown resistance of an insulating layer and a reduction in a long-term reliability.

2. Description of Related Art

As a semiconductor device, for example, when a MOS type transistor is manufactured, it is necessary to form a source diffusion region, a drain diffusion region and a channel region on a main surface of a silicon substrate and at least form a gate insulating layer on the channel region. The gate insulating layer is usually composed of a silicon oxide film, a metal oxide film and the like.

Also, when a thin film transistor (TFT) is manufactured as a semiconductor device, it is necessary to form a gate insulating layer composed of a silicon oxide film on a surface of a silicon layer formed on an insulation substrate.

Since a gate electrode and the channel region are surely insulated by the gate insulating layer, it is not too much to say that the reliability of the semiconductor device is reserved.

For this reason, a high dielectric breakdown resistance and a long-term reliability are always required of the gate insulating layer composed of the silicon oxide film, the metal oxide film and the like.

By the way, a silicon gate type of a transistor is well known which has a gate electrode formed by depositing a silicon film on a gate insulating layer formed through oxidization reaction.

In the above-mentioned transistor, the silicon film is formed by the CVD method in many cases. In such a case, material gas, such as a monosilane ($SiH_4$) gas and the like, is introduced into a CVD furnace where a temperature and a pressure satisfying a predetermined film formation condition are maintained. Then, in a high temperature atmosphere, the silicon film is deposited on the gate insulating layer.

However, even in the case of the inclusion of the gate insulating layer in which the high dielectric breakdown resistance can be obtained, if the silicon film is then deposited in the high temperature atmosphere of the $SiH_4$ gas as mentioned above, there may possibly occur a problem as described below.

That is, as shown in FIG. 4, suppose that a silicon oxide film 42 which has silicon (Si) and oxygen (O) as constituent elements and has no defect is formed on a silicon wafer 40.

In this case, when a silicon film 44 (refer to FIG. 6) is deposited in the high temperature atmosphere, the silicon oxide film 42 is exposed to the $SiH_4$ gas that is a so-called reducing gas. Thus, as shown in FIG. 5, when the oxygen contained in the gate insulating layer 42 as the constituent element is coupled to hydrogen (H) in the $SiH_4$ gas, the oxygen is lost by the amount corresponding to the coupling from the gate insulating layer 42.

For this reason, as shown in FIG. 6, after the deposition of the silicon film 44, it becomes the silicon oxide film 42 having oxygen deficiency 46. Thus, this results in the drop in the dielectric breakdown resistance and the reduction in the long-term reliability of the gate insulating layer 42.

SUMMARY OF THE INVENTION

The present invention is proposed in view of the above-mentioned problems. Accordingly, the present invention provides a manufacturing method of manufacturing a semiconductor device, which while forming a conductive layer on an oxide film formed as an insulating layer by using the CVD method, protects the oxygen deficiency of the oxide film without any drop in the dielectric breakdown resistance as the insulating layer of the oxide film and without any reduction in the long-term reliability.

This invention aims at a fact that when the conductive layer is deposited by using the CVD method after the formation of the oxide film as the insulating layer, if the oxide film is not exposed to a reducing atmosphere, the problem of the deficiency of oxygen contained in the oxide film as the constitutent element of a compound can be solved. Then, the repetition of various experiments leads to the present invention.

The method of manufacturing the semiconductor device, according to the present invention, is characterized in that when the conductive film is formed on the oxide film formed as the insulating layer, the conductive film is formed in a non-reducing atmosphere.

In the method of manufacturing the semiconductor device according to the present invention, the conductive layer is not formed in the conventional reducing atmosphere but in the non-reducing atmosphere. Thus, oxygen contained in the oxide film as the constituent element of the compound is not lost when the conductive layer is formed. For this reason, the oxygen deficiency is not induced in the oxide film as the insulating layer. Hence, it is possible to obtain the semiconductor device without any drop in the dielectric breakdown resistance as the insulating layer and without any reduction in the long-term reliability.

For example, when the silicon film is formed as the conductive layer, a silicon material gas that does not contain hydrogen as the constituent element of the compound can be used as the material gas constituting the non-reducing atmosphere. In specific, the silicon material gas can be composed of silicon tetrachloride ($SiCl_4$), disilicon hexachloride ($Si_2Cl_6$) or $Si_xCl_{2x+2}$ ($x \geq 3$) of a higher order.

Also, when a silicon germanium film is formed as the conductive layer, a germanium material gas and the silicon material gas that do not contain hydrogen as the constituent element of the compound can be used as the material gas constituting the non-reducing atmosphere. Specifically, the silicon material gas can be composed of $SiCl_4$, $Si_2Cl_6$ or $Si_xCl_{2x+2}$ ($x \geq 3$) of a higher order, and the germanium material gas can be composed of germanium tetrachloride ($GeCl_4$).

For example, the oxide film can be made of any of silicon dioxide ($SiO_2$), hafnium dioxide ($HfO_2$), alumina ($Al_2O_3$), zirconium dioxide ($ZrO_2$), ditantalum pentaoxide ($Ta_2O_5$), praseodymium dioxide ($PrO_2$), lanthanum oxide ($LaO_x$), titanium dioxide ($TiO_2$) and diniobium pentaoxide ($Nb_2O_5$).

Also, a phosphorus material gas and the silicon material gas that do not contain hydrogen as the constituent element of the compound are used as the material gas constituting the non-reducing atmosphere, and a phosphorus doped silicon film can be formed as the conductive layer.

Specifically, the silicon material gas can be composed of $SiCl_4$, $Si_2Cl_6$ or $Si_xCl_{2x+2}$ ($x \geq 3$) of a higher order, and the phosphorus material gas can be composed of phosphorus trioxide ($PCl_3$), phosphorus tri-bromide ($PBr_3$), phosphorus pentachloride ($PCl_5$) or phosphorus pentabromide ($PBr_5$). Also, the oxide film can be made of any of $SiO_2$, $HfO_2$, $Al_2O_3$, $ZrO_2$, $Ta_2O_5$, $PrO_2$, $LaO_x$, $TiO_2$ and $Nb_2O_5$.

As mentioned above, according to the present invention, it is possible to obtain the semiconductor device, in which when the conductive film is formed on the oxide film formed as the insulating layer, the conductive film is formed in the non-reducing atmosphere, and while the conductive layer is formed on the oxide film by the CVD method and the like, the oxygen deficiency of the oxide film can be avoided without any drop in the dielectric breakdown resistance as the insulating layer of the oxide film and without any reduction in the long-term reliability.

DESCRIPTION OF THE PREFERRED EMBODIMENTS

The embodiments of the present invention will be specifically described below in detail by exemplifying the embodiments with reference to the attached drawings The film formation condition, such as a film formation temperature, a film formation pressure, a gas flow rate or the like, which is explained in the following embodiments, is one exemplification. The present invention is not limited to this exemplification.

First Embodiment of Manufacturing Method

Figure 1:
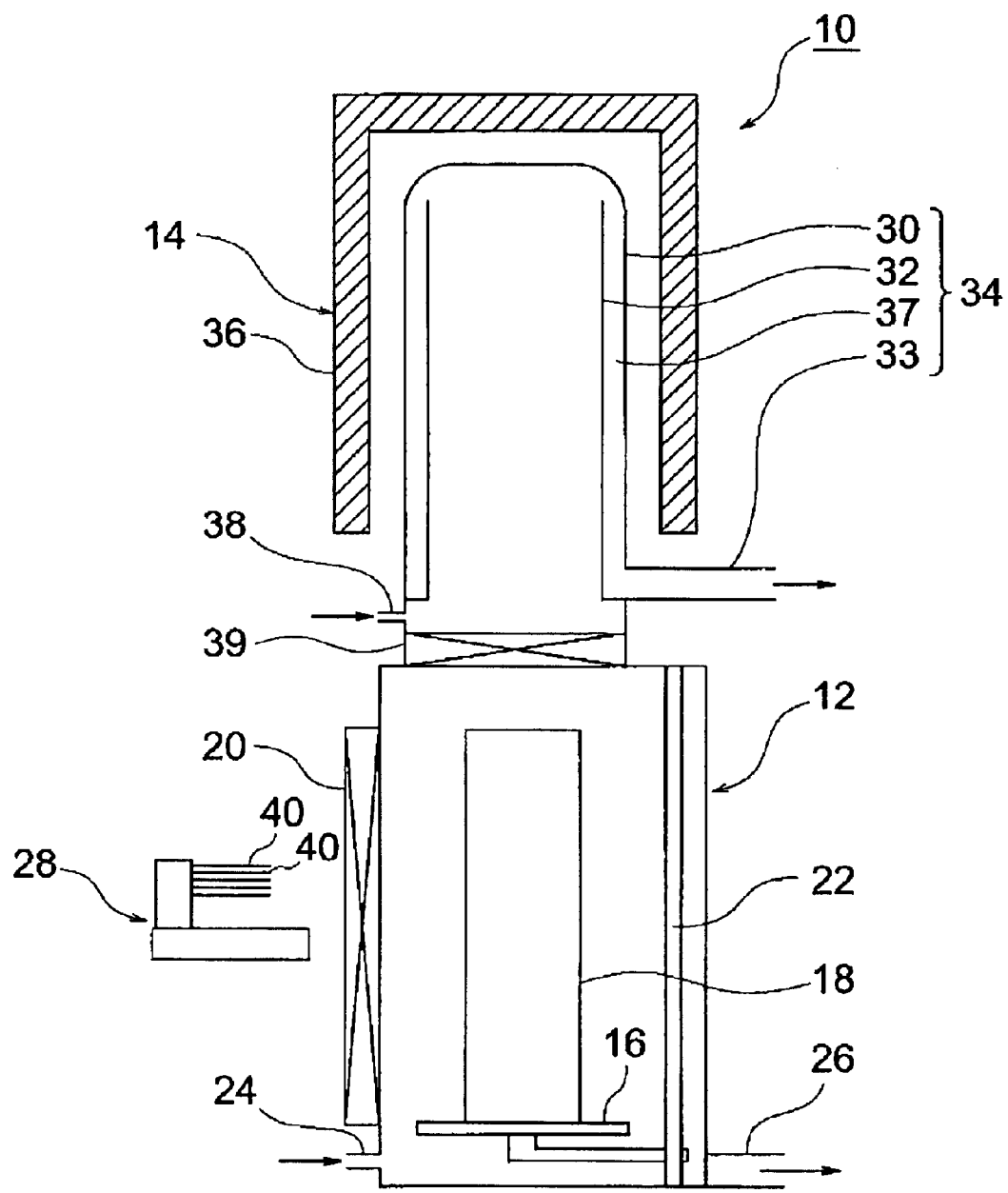
FIG. 1 is a side section view showing a configuration of a vertical CVD furnace used in a method of manufacturing a semiconductor device according to the present invention.
Figure 2:
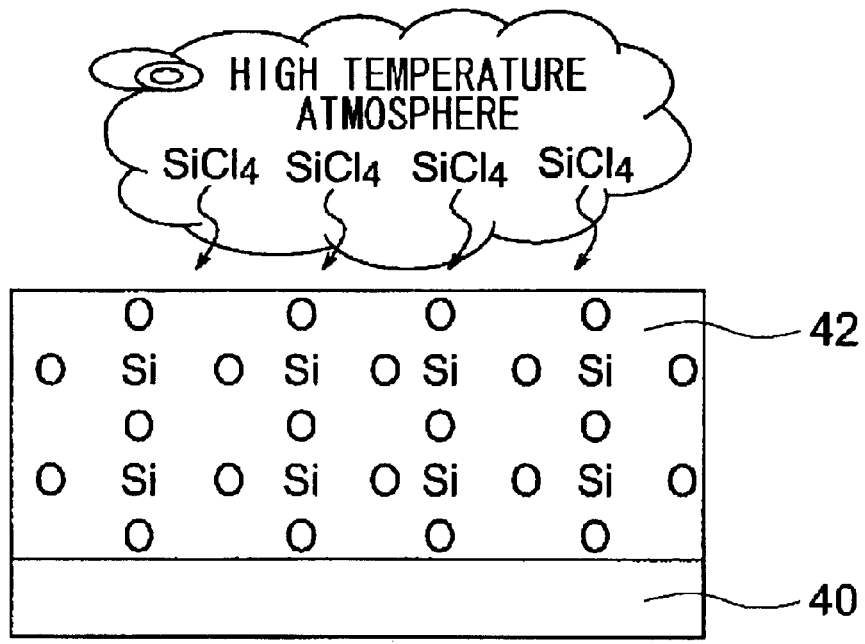
FIG. 2 is a section view diagrammatically showing a film formation situation based on a manufacturing method according to the present invention.
Figure 3:
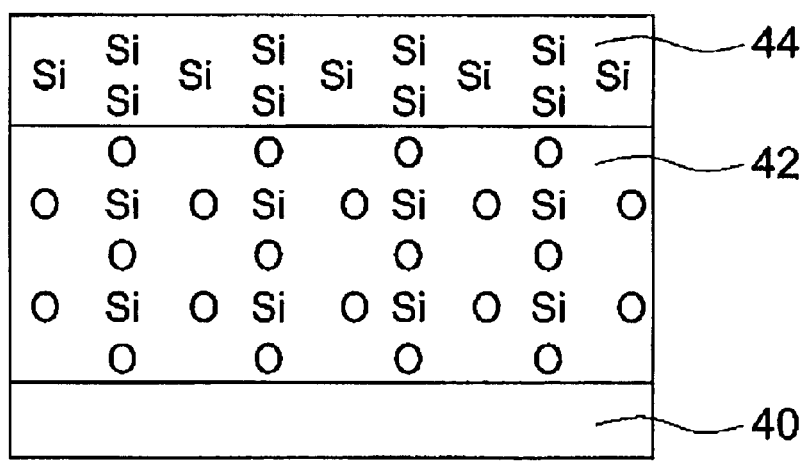
FIG. 3 is a section view diagrammatically showing the film formation situation based on a manufacturing method according to the present invention.

This embodiment is one example of the embodiments of the method of manufacturing a semiconductor device according to the present invention. FIG. 1 is a side section view showing a configuration of a vertical CVD furnace of a load lock type used in this manufacturing method, and FIGS. 2, 3 are section views diagrammatically showing the film formation situations based on the manufacturing method in this embodiment.

In this embodiment, when a semiconductor integrated circuit is manufactured, a vertical CVD furnace 10 shown in FIG. 1 is used to form a silicon oxide film as a gate insulating layer 42 on a silicon wafer (substrate) 40, and a silicon film is formed on this silicon oxide film as a conductive layer 44 serving as a gate electrode.

As shown in FIG. 1, the vertical CVD furnace 10 is a typical type used in a conventional low pressure CVD method, and it is provided with a load lock chamber 12 and a reactive furnace 14 placed on the load lock chamber 12.

A boat 18 having a seal cap 16 at a bottom is built in the load lock chamber 12, which includes a gate valve 20 for opening/closing the lock chamber and a boat elevator 22, and also includes a purge gas supply tube 24 and an exhaust line 26.

Also, it is configured such that a wafer loader 28 is automatically advanced or withdrawn through the gate value 20 into or from the load lock chamber 12.

The reactive furnace 14 includes: a reactive tube 34 having an outer tube 30, an inner tube 32 and an exhaust tube 33 connected to a space 37 between the outer tube 34 and the inner tube 32; a gas introduction tube 38 placed at a lower portion of the reactive tube 34; and a heater 36 placed so as to cover the reactive tube 34.

A gate valve 39 for connecting/disconnecting the reactive furnace 14 and the load lock chamber 12 in accordance with its opening/closing operation is placed at the bottom of the reactive furnace 14.

The specific steps in this manufacturing method using the vertical CVD furnace 10 will be described below. Here, a diffusing step of forming a silicon oxide film as a gate insulating layer of a MOS type transistor and a low pressure CVD step of forming a silicon film as a gate electrode on a silicon oxide film ($SiO_2$) are mainly described.

At first, the silicon oxide film is formed as the gate insulating layer 42 on a surface of the silicon wafer 40 (refer to FIG. 2), for example, by a thermal oxidization reaction.

In this forming step, a well known method is used to form an element insulation region having a LOCOS structure on a main surface of the silicon wafer 40. After that, an ion implantation for well formation and an ion implantation for channel stopper formation are carried out, and an ion concentration is adjusted to thereby adjust a threshold. Consequently, the structure, in which the silicon oxide film 42 containing silicon (Si) and oxygen (O) as the constituent elements of the compound in a good state is formed is obtained on the silicon wafer 40 (refer to FIG. 2).

Next, as shown in FIG. 1, a plurality of silicon wafers 40 (five silicon wafers in FIG. 1) on which the gate insulating layers 42 are formed as mentioned above are set for the wafer loader 28.

In succession, the gate valve 20 of the load lock chamber 12 in which an inner pressure is kept at an ambient pressure is opened, and the silicon wafer 40 is loaded to the boat 18 by the automatically driven wafer loader 28.

After that, after the gate valve 20 is closed, the exhausting operation (vacuuming) is carried out through the exhaust line 26, and the inside of the load lock chamber 12 is decompressed.

In succession, when a pressure in the load lock chamber 12 reaches a predetermined vacuum pressure, the gate valve 39 of the reactive furnace 14 is opened to thereby elevate the boat elevator 22 and insert the boat 18 into the reactive furnace 14.

A furnace setting temperature at this time is not especially limited. In this embodiment, for example, it can be set at 600° C. equal to a film formation temperature.

After that, the gate valve 39 is closed, and inert gas, such as an argon gas and the like is introduced from the gas introduction tube 38 to the reactive furnace 14, and the pressure thereof is raised to a film formation pressure.

Then, when the temperature and the pressure in the reactive furnace 14 satisfy the film formation condition, non-reducing $SiCl_4$ gas (non-reducing gas) that does not contain hydrogen as the constituent element of the compound is introduced as the material gas from the gas introduction tube 38. Then, the film formation of the conductive layer 44 on the gate insulating layer 42 is started.

In this embodiment, a growth rate is 0.5 nm/min when the silicon film is formed as the conductive layer 44 serving as the gate electrode. The film formation process of 150 minutes is carried out to thereby obtain the silicon film 44 having a desired film thickness of 70 nm. The film formation condition at this time is as follows:

Film Formation Temperature: 600° C.
Film Formation Pressure: 20 Pa
Gas Flow Rate: $SiCl_4$ Gas=200 sccm Under the above-mentioned film formation condition, when the conductive layer 44 is grown on the gate insulating layer 42, the exposed gate insulating layer 42 at the time of the film formation of the conductive layer 44 is exposed to the non-reducing atmosphere into which the $SiCl_4$ gas is introduced as shown in FIG. 2.

Thus, without any oxygen deficiency on the gate insulating layer 42, as shown in FIG. 3, the situation where the silicon film 44 is formed is obtained on the silicon oxide film 42 containing Si and O in the good state. Hence, the gate insulating layer 42 with the good dielectric breakdown resistance can be obtained to thereby attain the good long-term reliability.

Then, after the completion of the film formation of the conductive layer 44, the purging and exhausting (vacuuming) operations are done from the gas introduction tube 38 and the exhaust tube 33 of the vertical CVD furnace 10, in order to remove the remaining gas in the reactive furnace 14.

In succession, the gate valve 39 of the reactive furnace 14 is opened to lower the boat elevator 22 and thereby pull the boat 18 in the reactive furnace 14 to the side of the load lock chamber 12. Then, the gate valve 39 is closed.

Next, in order to raise the pressure in the load lock chamber 12 to the ambient pressure atmosphere, while the exhausting operation from the exhaust line 26 is done, the atmospheric air is introduced from the purge gas supply tube 24.

After that, the gate valve 20 of the load lock chamber 12 is opened, and the processed silicon wafer 40 is taken out from the boat 18 by the wafer loader 28.

Second Embodiment of Manufacturing Method

This embodiment differs from the first embodiment in that a silicon germanium film is formed as the conductive layer 44 on the silicon wafer 40. Here, steps subsequent to the film formation step of the conductive layer 44 after the formation of the gate insulating layer 42 is explained.

The introduction of the argon gas and the like into the reactive furnace 14 causes the pressure to reach the film formation pressure. Then, when the temperature and the pressure satisfy the film formation condition, the $SiCl_4$ gas as the material gas at the time of the film formation is firstly introduced into the reactive furnace 14 from the gas introduction tube 38, and a seed layer is formed. The film formation condition at this time is as follows:

Film Formation Temperature: 600° C.
Film Formation Pressure: 40 Pa
Gas Flow Rate: $SiCl_4$ Gas=1500 sccm The process based on this condition is required to improve surface morphology. However, the present invention does not depend on the presence or absence of this process.

Next, $GeCl_4$ gas is introduced, in addition to the $SiCl_4$ gas already introduced into the reactive furnace 14, in order to form the silicon germanium film as the conductive layer 44. At this time, a growth rate of the silicon germanium film is 0.5 nm/min. The film formation process of 110 minutes is carried out to thereby obtain the silicon film 44 having a desired film thickness of 50 nm. The film formation condition at this time is as follows:

Film Formation Temperature: 600° C.
Film Formation Pressure: 40 Pa
Gas Flow Rate: $SiCl_4$ Gas=1500 sccm
$GeCl_4$ Gas=1500 sccm After that, the silicon wafer 40 is taken out from the load lock chamber 12 by the procedure similar to that of the first embodiment.

The effect similar to that of the first embodiment can be obtained even if, as in this embodiment, the silicon oxide film is formed as the gate insulating layer 42 and the silicon germanium film is formed as the conductive layer 44.

Third Embodiment of Manufacturing Method

This embodiment differs from the first embodiment in that a phosphorus doped silicon film is formed as the conductive layer 44 on the silicon wafer 40. Here, steps subsequent to the film formation step of the conductive layer 44 after the formation of the gate insulating layer 42 is explained.

The introduction of the argon gas and the like into the reactive furnace 14 causes the pressure to reach the film formation pressure. Then, when the temperature and the pressure satisfy the film formation condition, the $SiCl_4$ gas and a $PCl_3$ gas as the material gas at the time of the film formation are firstly introduced into the reactive furnace 14 from the gas introduction tube 38. The film formation of the phosphorus doped silicon film as the conductive layer 44 is started. At this time, a growth rate of the phosphorus doped silicon film is 0.4 nm/min. The film formation process of 110 minutes is carried out to thereby form a desired film thickness of 40 nm. The film formation condition at this time is as follows:

Film Formation Temperature: 600° C.
Film Formation Pressure: 350 Pa
Gas Flow Rate: $SiCl_4$ Gas=400 sccm
$PCl_3$ Gas=100 sccm After that, the silicon wafer 40 is taken out from the load lock chamber 12 by the procedure similar to that of the first embodiment.

The effect similar to that of the first embodiment can be obtained even if, as in this embodiment, the silicon oxide film is formed as the gate insulating layer 42 and the phosphorus doped silicon film is formed as the conductive layer 44.

Fourth Embodiment of Manufacturing Method

This embodiment is effective when, in manufacturing a semiconductor integrated circuit, a metal oxide film as the gate insulating layer 42 is formed on the silicon wafer 40, and a silicon germanium film is formed as the conductive layer 44 on this metal oxide film.

Figure 4:
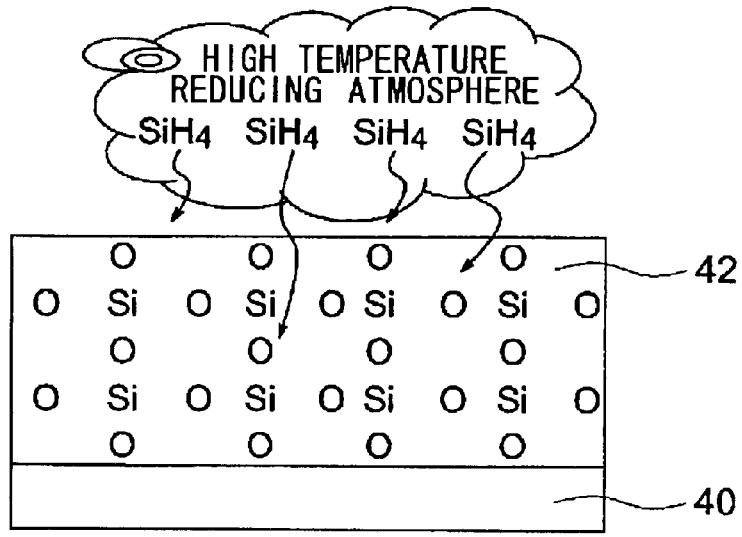
FIG. 4 is a section view diagrammatically showing a film formation situation based on a conventional method of manufacturing a semiconductor device.
Figure 5:
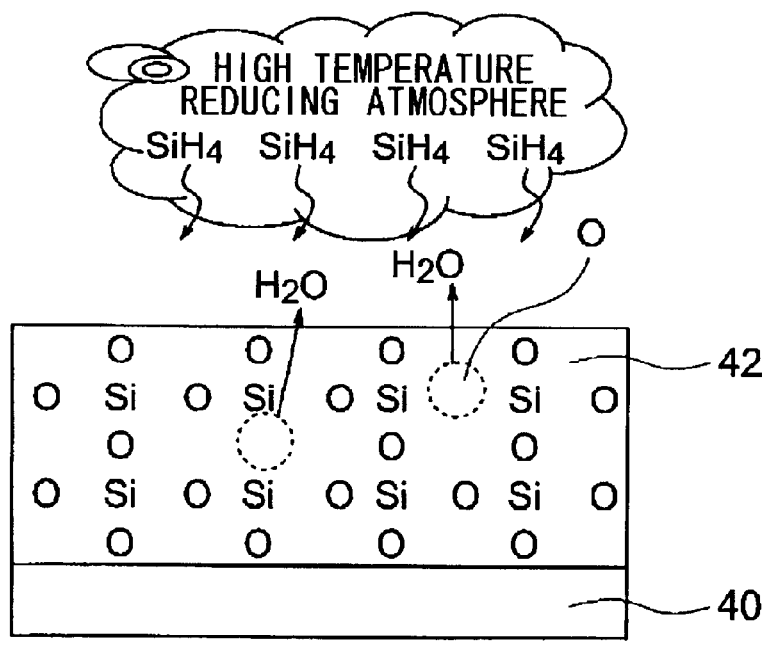
FIG. 5 is a section view diagrammatically showing a film formation situation based on a conventional manufacturing method.
Figure 6:
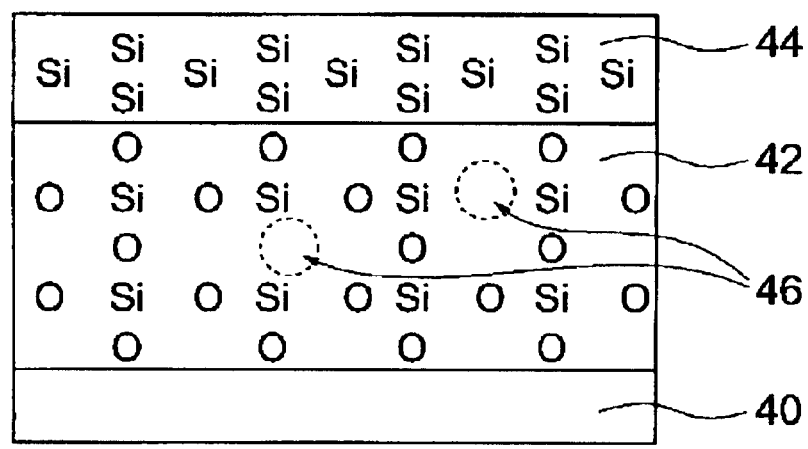
FIG. 6 is a section view diagrammatically showing the film formation situation based on a conventional manufacturing method.

This embodiment will be described below with reference to FIGS. 2 to 4. The step of forming the metal oxide film as the gate insulating layer 42 of the MOS type transistor and the low pressure CVD step of forming the silicon germanium film as the conductive layer 44 on this metal oxide film are mainly described in this embodiment.

At first, the metal oxide film is formed as the gate insulating layer 42 on a surface of the silicon wafer 40.

In the forming step of the metal oxide film, the ion implantation for the well formation, the ion implantation for the channel stopper formation and the threshold adjustment are performed on the main surface of the silicon wafer 40, by using the method similar to that of the first embodiment.

Next, the metal oxide film as the gate insulating layer 42 is obtained by forming an $HfO_2$ film on the surface of the silicon wafer 40, for example, by using an ALD (Atomic Layer Deposition) method. Besides this method, any of $Al_2O_3$, $ZrO_2$, $Ta_2O_5$, $PrO_2$, $LaO_x$, $TiO_2$ and $Nb_2O_5$ can be formed as the metal oxide film.

Moreover, after the silicon wafer 40 on which the gate insulating layer 42 is formed is set on the wafer loader 28, the boat 18 is inserted into the reactive furnace 14 by the process similar to that of the first embodiment. Moreover, after the gate valve 39 is closed, the inert gas such as the argon gas and the like is introduced to thereby raise the pressure in the reactive furnace 14 to the film formation pressure.

Next, when the temperature and the pressure satisfy the film formation condition, the $SiCl_4$ gas as the material gas at the time of the film formation is firstly introduced from the gas introduction tube 38 into the reactive furnace 14. Then, the seed layer is formed. The film formation condition at this time is as follows:

Film Formation Temperature: 600° C.

Film Formation Pressure: 40 Pa

Gas Flow Rate: $SiCl_4$ Gas=1500 sccm

The process based on this condition is required to improve the surface morphology, similarly to the second embodiment. However, the present invention does not depend on the presence or absence of this process.

Next, the $GeCl_4$ gas is introduced, in addition to the $SiCl_4$ gas already introduced into the reactive furnace 14, in order to form the silicon germanium film as the conductive layer 44. At this time, the growth rate of the silicon germanium film is 0.5 nm/min. The film formation process of 110 minutes is carried out to thereby obtain the silicon film 44 having the desired film thickness of 50 nm. The film formation condition at this time is as follows:

Film Formation Temperature: 600° C.

Film Formation Pressure: 40 Pa

Gas Flow Rate: $SiCl_4$ Gas=1500 sccm $GeCl_4$ Gas=1500 sccm

After that, the silicon wafer 40 is taken out from the load lock chamber 12 by the procedure similar to that of the first embodiment.

The effect similar to that of the first embodiment can be obtained even if, as in this embodiment, the $HfO_2$ film is formed as the gate insulating layer 42 and the silicon germanium film is formed as the conductive layer 44.

In the above-mentioned first to fourth embodiments, the element insulation region may have the trench structure, or it may be the combination of the LOCOS structure and the trench structure. The present invention can be applied independently of the gate structure.

Also, in the first to fourth embodiments, it is possible to use a single wafer CVD furnace (not shown) instead of the vertical CVD furnace 10.

The shape of the gas introduction tube 38 and the gas introduction method in the first to fourth embodiments are not limited to the above-mentioned examples. For example, a multi-nozzle can be used to introduce the gas into the reactive furnace 14.

Also, in the first to fourth embodiments, the present invention is applied to the formation of the gate electrode of the MOS type transistor. However, the present invention is not limited to it. The present invention can be also applied to a configuration example, in which a dielectric film of a capacitor formed in a semiconductor device is used as an insulating layer, and a silicon film formed on this insulating layer is used as a conductive layer.

What is claimed is:

1. A method of manufacturing a semiconductor device, wherein:

a conductive film is formed on an oxide film formed as an insulating layer, said conductive film is formed in a non-reducing atmosphere formed of a gas that that does not contain hydrogen as a constituent element of a compound used as a material gas constituting said non-reducing atmosphere, and a germanium material gas and a silicon material gas that do not contain hydrogen as a constituent element of a compound are used as said material gas constituting said non-reducing atmosphere, and a silicon-germanium film is formed as said conductive layer.

2. A method of manufacturing a semiconductor device according to claim 1, wherein said silicon material gas is composed of $SiCl_4$, $Si_2Cl_6$ or $Si_xCl_{2x+2}$ ($x \geqq 3$) of a higher order, and said germanium material gas is composed of $GeCl_4$.

3. A method of manufacturing a semiconductor device according to any one of claims to 2, wherein said oxide film is made of any of $SiO_2$, $HfO_2$, $Al_2O_3$, $ZrO_2$, $Ta_2O_5$, $PrO_2$, $LaO_x$, $TiO_2$ and $Nb_2O_5$.

4. A method of manufacturing a semiconductor device, wherein a conductive film is formed on an oxide film formed as an insulating layer, said conductive film is formed in a non-reducing atmosphere wherein phosphorus material gas and silicon material gas that do not contain hydrogen as a constituent element of a compound are used as material gas constituting said non-reducing atmosphere, and a phosphorus doped silicon film is formed as said conductive layer.

5. A method of manufacturing a semiconductor device according to claim 4, wherein said silicon material gas is composed of $SiCl_4$, $Si_2Cl_6$ or $Si_xCl_{2x+2}$ ($x \geqq 3$) of a higher order, and said phosphorus material gas is composed of $PCl_3$, $PBr_3$, $PCl_5$, or $PBr_5$.

6. A method of manufacturing a semiconductor device according to either one of claim 4 and 5, wherein said oxide film is made of any of $SiO_2$, $HfO_2$, $Al_2O_3$, $ZrO_2$, $Ta_2O_5$, $PrO_2$, $LaO_x$, $TiO_2$ and $Nb_2O_5$.

* * * * *